United States Patent
Aoki et al.

(10) Patent No.: US 7,186,354 B2
(45) Date of Patent: Mar. 6, 2007

(54) ANTICORROSIVE TREATING CONCENTRATE

(75) Inventors: Hidemitsu Aoki, Tokyo (JP); Hiroaki Tomimori, Tokyo (JP); Masayuki Takashima, Osaka (JP)

(73) Assignees: NEC Electronics Corporation, Kanagawa (JP); Sumitomo Chemical Company Limited, Osaka (JP)

(*) Notice: Subject to any disclaimer, the term of this patent is extended or adjusted under 35 U.S.C. 154(b) by 0 days.

(21) Appl. No.: 09/797,587

(22) Filed: Mar. 5, 2001

(65) Prior Publication Data

US 2001/0030315 A1    Oct. 18, 2001

(30) Foreign Application Priority Data

Mar. 3, 2000    (JP)    ............... 2000-058376

(51) Int. Cl.
*C09K 3/00*    (2006.01)
*C23F 11/00*   (2006.01)

(52) U.S. Cl. ........................ 252/390; 252/394
(58) Field of Classification Search ............. 252/388, 252/390, 394
See application file for complete search history.

(56) References Cited

U.S. PATENT DOCUMENTS

| | | | |
|---|---|---|---|
| 3,265,620 A * | 8/1966 | Heiman | .............. 508/275 |
| 4,276,186 A | 6/1981 | Bakos et al. | |
| 5,795,702 A * | 8/1998 | Tanabe et al. | ........... 430/331 |
| 5,997,658 A | 12/1999 | Peters et al. | |
| 6,068,879 A * | 5/2000 | Pasch | ................ 427/97 |
| 6,140,027 A * | 10/2000 | Baik | ................ 430/331 |
| 6,194,366 B1 * | 2/2001 | Naghshineh | ........... 510/175 |

FOREIGN PATENT DOCUMENTS

| | | |
|---|---|---|
| JP | 57-152476 | 9/1982 |
| JP | 59-143091 | 8/1984 |
| JP | 5-315331 | 11/1993 |
| JP | 9-63754 | 3/1997 |
| JP | A 9-96911 | 4/1997 |
| JP | A 9-269601 | 10/1997 |
| JP | A 10-26832 | 1/1998 |
| JP | A 2000-195831 | 7/2000 |
| JP | A 2000-252242 | 9/2000 |
| JP | A 2001-222118 | 8/2001 |
| JP | A 2001-242642 | 9/2001 |
| KR | 1991-0007160 | 2/1991 |
| KR | 10-0222287 | 10/1999 |
| WO | 9934940 | * 7/1999 |
| WO | 00/39844 | 7/2000 |

* cited by examiner

*Primary Examiner*—Cephia D. Toomer
(74) *Attorney, Agent, or Firm*—Young & Thompson

(57) ABSTRACT

According to the present invention, there is provided an anticorrosive treating concentrate usable for an exposed surface of a metal (e.g. copper or a copper alloy), containing an anticorrosive agent and a precipitation inhibitor and having a pH of 4 to 12 when used in the form of an aqueous solution, in which concentrate the anticorrosive agent is a triazole type compound and/or a derivative thereof and is contained in a concentration of 0.05 to 20% by weight and the precipitation inhibitor is a compound having at least one nitrogen atom but no metal atom in the molecule.

27 Claims, 1 Drawing Sheet

ANTICORROSIVE TREATING CONCENTRATE

BACKGROUND OF THE INVENTION

1. Field of the Invention

The present invention relates to an anticorrosive treating solution for a semiconductor substrate having an exposed surface of copper or a copper-containing alloy. More particularly, the present invention relates to an anticorrosive treating concentrate which causes no quality deterioration during the carriage or storage.

2. Description of the Related Art

Aluminum, an aluminum alloy, copper and a copper-containing alloy have heretofore been used as various kinds of electrical wirings, for their electrical conductivity.

In recent years, the integration of semiconductor devices has become increasingly high and the wiring pattern formed on the substrate has become increasingly fine. As a result, there are fears of, for example, reduction in circuit response speed caused by finer wiring width and smaller wiring sectional area and reduction in wiring life owing to the activated electromigration (EM) incurred by increased heat generation, current density, etc.

In order to deal with such problems, it has become common to use copper or copper alloy wirings which are superior to aluminum-based wirings in electrical conductivity, heat resistance, electromigration resistance.

As an example, an insulating layer is formed on a semiconductor substrate or the like; in the insulating layer are formed grooves for wiring and via holes for connection with lower layer metal wiring; thereon is formed a metal film made of copper, a copper alloy or the like.

Then, to the surface of the resulting semiconductor substrate is applied CMP (chemical mechanical polishing) to remove the metal film at the portion other than the grooves and the via holes, whereby wirings and plugs are formed. At this time, copper or a copper alloy is exposed at the surface of the resulting semiconductor substrate.

The semiconductor substrate after CMP is ordinarily subjected to surface cleaning with a chemical solution using a cleaning machine, to remove the abrasive and polishing residue sticking to the substrate surface; thereby, a semiconductor substrate having a cleaned surface is obtained.

Then, cleaning with chemical solution and drying are conducted; thereafter, an insulating film (or a protective film) are formed on the wirings, or the substrate after the above cleaning and drying is allowed to stand in the atmosphere before formation of the insulating film. Here, the chemical solution used in cleaning or storage is referred to as anticorrosive treating solution.

Copper is a metal which is easily oxidized or corroded. Therefore, the fresh metal surface after CMP is very active and, during the above-mentioned cleaning or temporary standing in the atmosphere, tends to be oxidized or stained by the oxygen or ions dissolved in the cleaning solution or the like or by the oxygen in the atmosphere or the like.

As mentioned above, when there is formed a pattern of wirings of copper or a copper alloy on a semiconductor substrate by a damascene process or the like, the fresh metal (e.g. copper) surface after CMP is subjected to, for example, a cleaning treatment or subsequent temporary standing in the atmosphere and therefore inevitably undergoes oxidation, etc.

Wirings of copper or its alloy are used in place of conventional wirings of aluminum or its alloy for various excellent properties; however, they undergo oxidation, corrosion, etc. very easily.

The fresh metal surfaces of wirings after CMP is flat and makes easy formation of an insulating film (or a protective film) thereon; however, the fresh metal surfaces are very active and is very easily oxidized or corroded during the above-mentioned cleaning treatment or standing in the atmosphere. This oxidation or corrosion is striking particularly in the portions of the surfaces where grain boundaries are clearly seen.

It has heretofore been investigated to use, for rust-preventive treatment or cleaning treatment of a metal surface, a rust-preventive agent such as benzotriazole or the like. In, for example, JP-A-5-315331 (hereinafter referred to as "conventional case 1"), it is described to use, in cleaning treatment of copper or its alloy provided as a wiring pattern or an electrode in a semiconductor device substrate, an aqueous cleaning solution containing 0.04 to 1% of benzotriazole (BTA), to give rise to a copper/BTA reaction on the copper wiring to form an insoluble copper/BTA film (a protective film) and suppress the corrosion of the copper wiring.

In general, an anticorrosive treating solution is used in the form of an anticorrosive treating concentrate or a water-diluted solution thereof, depending upon the BTA concentration required when the concentrate or the water-diluted solution thereof is used.

In the anticorrosive treating concentrate, the concentration of the effective ingredient contained therein is desired to be as low as possible in view of the carriage cost. For example, when a 0.001% aqueous BTA solution is used in an amount of 1,000 $m^3$ in a cleaning step and when a concentrate therefor is carried in a BTA concentration of 0.001%, the concentrate need be carried in an amount of 1,000 $m^3$; however, when the concentrate is carried in a BTA concentration of 1%, the amount of the concentrate carried is as small as 1 $m^3$, enabling significant reduction in carriage cost to 1/1,000. Thus, the BTA concentration in the anticorrosive treating concentrate is desirably as high as possible.

Meanwhile, benzotriazole type compounds and derivatives thereof have low solubilities in water, in general. In the case of, for example, BTA, its solubility in water is ordinarily only about 1.9 wt-% (hereinafter, % used for concentration refers to wt-%) in water of 20° C.

Therefore, when a 1.9% aqueous BTA solution is carried or stored, the BTA solution becomes a supersaturated aqueous solution when the environmental temperature gets lower than 20° C. When an external impact is applied to the supersaturated aqueous solution or its temperature becomes even lower, the solution is unable to exist as a stable solution and precipitates crystals.

In FIG. 1 is shown the solubility of BTA in water of 0 to 80° C. The solubility of BTA in water is, for example, about 8% at 80° C., about 4% at 30° C., about 1.9% at 20° C. and about 1% at 10° C.

As is clear from FIG. 1, when a 1.9% aqueous BTA solution is cooled to 10° C., the BTA solution first becomes an unstable supersaturated solution and then precipitates about 50% of the BTA originally dissolved in the solution; as a result, the BTA concentration in the solution becomes about 1%. Consequently, there occurs a reduction in BTA concentration, BTA crystals are precipitated in the solution, and the original anticorrosive treating concentrate becomes a concentrate of lower corrosion inhibitability.

In using an aqueous BTA solution in a process for semiconductor device production, this anticorrosive treating solution is ordinarily used at such an effective ingredient concentration as to cause no precipitation of crystals or the like and, moreover, the temperature of the process is controlled so that the original solubility of BTA in water is maintained; therefore, there is substantially no precipitation of BTA (see the column 6, lines 2 to 12 of the conventional case 1).

Meanwhile, anticorrosive treating concentrates such as aqueous BTA solution and the like are exposed to various temperature conditions.

There is considered, for example, a case that a 3% aqueous BTA solution (as an anticorrosive treating concentrate) is produced at an atmospheric temperature of 30° C. by stirring BTA in water for several hours. If this anticorrosive treating concentrate is carried to a cold district or is stored in a store house of cold district at an atmospheric temperature of , for example, 5° C., BTA is precipitated by an amount exceeding the solubility of 5° C. When the concentrate is carried in a container, the precipitated BTA particles form a dense and hard BTA layer on the inner wall, bottom, etc. of the container.

The BTA precipitate, once generated, is difficult to redissolve even by elevating the temperature of the concentrate to 30° C., and redissolution needs restirring of several hours using a stirrer. This strikingly impairs the operability at the operation site and reduces productivity. When the BTA-precipitated anticorrosive treating concentrate is diluted at a predetermined dilution ratio, the diluted solution has a BTA concentration lower than intended and is unable to exhibit the intended performance.

When an anticorrosive treating solution containing a precipitate of fine BTA crystals (hereinafter referred to as BTA particles) is used for cleaning of the surface of a semiconductor substrate, the BTA particles stick onto the surface and stains the surface. As a result, the resist pattern becomes discontinuous, inviting breakage of wirings. Or, the BTA particles stick onto the inner wall of each via hole, increasing the contact resistance. Thus, the resulting semiconductor device has increased defects.

An object of the present invention is to provide an anticorrosive treating concentrate used for corrosion inhibition treatment of a semiconductor substrate having an exposed surface of a metal such as copper, its alloy or the like, wherein the BTA contained as an effective ingredient is not precipitated at the temperatures encountered during the storage or carriage of the concentrate, even when the BTA is contained in a high concentration.

Other object of the present invention is to provide an anticorrosive treating concentrate which, when used for corrosion inhibition treatment of a semiconductor substrate by itself or in a diluted form, can show the same corrosion inhibitability as conventional aqueous BTA solutions do.

SUMMARY OF THE INVENTION

The present inventors made a study in order to achieve the above subject. As a result, the present inventors found out that an aqueous benzotriazole (BTA) solution can contain a higher concentration of BTA with no precipitation of BTA when a certain compound (a precipitation inhibitor) is allowed to coexist with BTA in the solution and that such an aqueous solution containing a higher concentration of BTA can be stored or carried at various environmental temperatures without precipitation of BTA. The finding has led to the completion of the present invention.

According to the present invention, there is provided an anticorrosive treating concentrate which is a concentrate for an anticorrosive treating solution used for corrosion inhibition treatment of a semiconductor substrate having an exposed surface of a metal, which concentrate contains:

a triazole type compound and/or a derivative thereof as an anticorrosive agent, and a precipitation inhibitor for the anticorrosive agent.

That is, according to the present invention, there is provided an anticorrosive treating aqueous concentrate used for corrosion inhibition treatment of a semiconductor substrate having an exposed metal, which can be stored, carried and used stably at ordinary environmental temperatures, causes no deterioration of exposed polished metal (copper or copper alloy) surface of semiconductor substrate, and shows excellent handleability during use for treatment.

This anticorrosive treating concentrate contains an anticorrosive agent and a precipitation inhibitor therefor; the anticorrosive agent is a triazole type compound and/or a derivative thereof; the precipitation inhibitor effectively prevents the anticorrosive agent from being suspended or becoming cloudy in the concentrate as fine particles and/or from being precipitated as agglomerates or crystals (these are hereinafter referred to as precipitated particles); and the anticorrosive agent and the precipitation inhibitor are dissolved completely in the anticorrosive treating concentrate.

According to the present invention, there is also provided a method for carrying an anticorrosive treating concentrate containing an anticorrosive agent consisting of a triazole type compound and/or a derivative thereof and a precipitation inhibitor therefor, by keeping the concentrate at temperatures which are at least the precipitation temperature of the anticorrosive agent contained in the concentrate.

According to the present invention, there is also provided a method for storing an anticorrosive treating concentrate containing an anticorrosive agent consisting of a triazole type compound and/or a derivative thereof and a precipitation inhibitor therefor, by keeping the concentrate at temperatures which are at least the precipitation temperature of the anticorrosive agent contained in the concentrate.

In the present anticorrosive treating concentrate containing, in combination, an anticorrosive agent and a precipitation inhibitor, the anticorrosive agent (whose water solubility is highly dependent upon the level of environmental temperature) is dissolved completely in the concentrate at ordinary environmental temperatures and generates no precipitated particles in the concentrate; therefore, the present concentrate can be stably carried from the manufacturer to its destination and can be stably stored there; thus, the present anticorrosive treating concentrate can be supplied stably.

As mentioned above, the present anticorrosive treating concentrate shows no change in concentration of anticorrosive agent or the like when supplied. Therefore, when the concentrate is diluted greatly and used for cleaning of, for example, copper or copper alloy wirings at the surface of a semiconductor substrate and even if the surfaces of the wirings are chemically or physically (e.g. viewed from the standpoint of adsorption) so active as to clearly show grain boundaries, it is possible to effectively avoid the surface deterioration or staining caused by particles precipitation, etc.

In the anticorrosive treating concentrate according to the present invention, the precipitation inhibitor effectively prevents the anticorrosive agent from being precipitated in the form of particles such as crystals or the like; thereby, the anticorrosive agent is dissolved completely in the concentrate. As a result, the surface of a semiconductor substrate can be completely covered by the solution. Therefore, it is considered that the damage such as surface etching by precipitation inhibitor can be prevented, a protective film is formed on the metal surface by the anticorrosive agent, and the formation of oxide film on metal surface by oxygen in atmosphere or by oxygen or ions dissolved in concentrate is prevented.

DETAILED DESCRIPTION OF THE PREFERRED EMBODIMENTS

Figure 1:
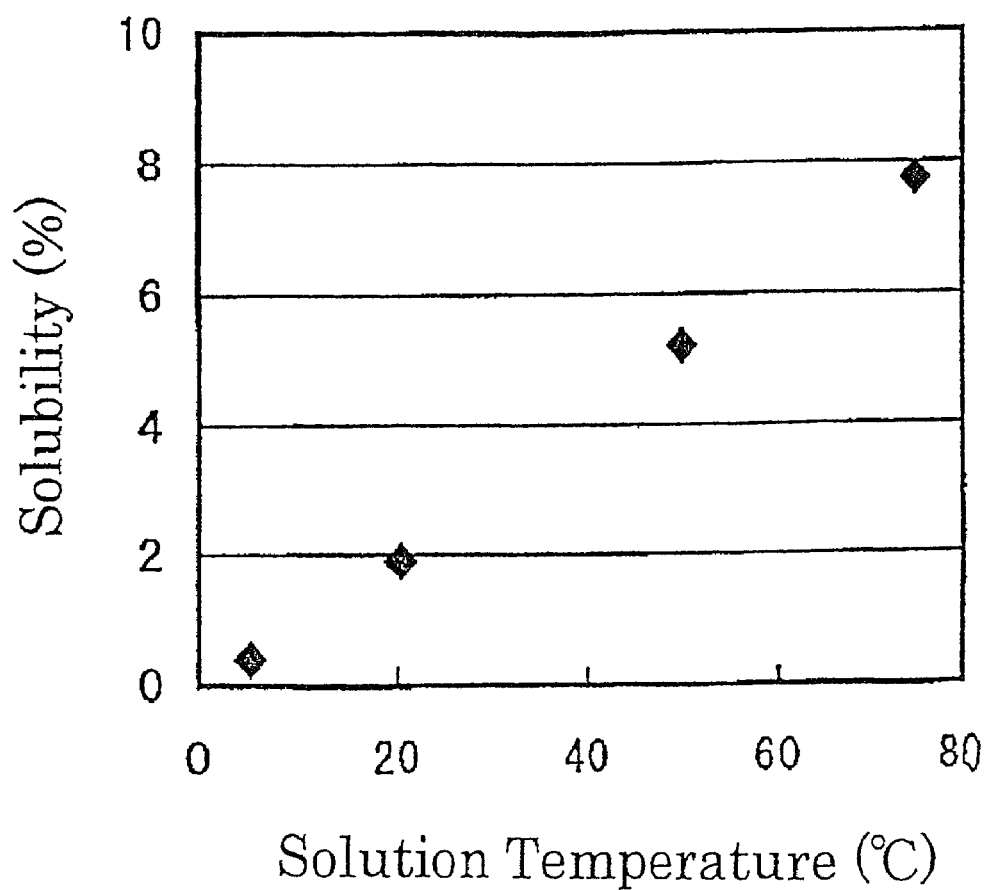
FIG. 1 is a drawing showing the solubility of benzotriazole (BTA) in water.

Description is made below on the anticorrosive treating concentrate according to the present invention, used for a semiconductor substrate having an exposed surface of a metal (e.g. copper or a copper-containing alloy), as well as on the production of the concentrate and the applications of the concentrate, i.e. the preservative solution, protective film-forming solution and cleaning solution obtained from the concentrate (each of these solutions is hereinafter referred to simply as anticorrosive treating solution).

Wirings of semiconductor device are ordinarily pattern wirings formed from copper or a copper alloy by a damascene process.

For example, an insulating layer is formed on a semiconductor substrate or the like; in the insulating layer are formed grooves for wirings and via holes for contact with lower-layer metal wirings; then, a metal film made of copper, a copper alloy or the like is formed.

Next, the surface of the resulting semiconductor substrate is subjected to CMP (chemical mechanical polishing) to remove the portion of the metal film other than the grooves and the via holes, whereby wirings and plugs are formed. At this time, the semiconductor substrate has an exposed surface of a metal (copper or a copper alloy), i.e. a fresh metal surface.

After the CMP, the surface of the semiconductor substrate is ordinarily subjected to a cleaning step, that is, cleaned with a chemical solution using a cleaning machine, to remove the abrasive and the polishing residue both sticking to the surface, whereby a semiconductor substrate having a cleaned metal surface is obtained.

The chemical solution used in the above cleaning step needs to be able to not only remove the foreign matter sticking to the semiconductor substrate surface but also prevent the corrosion of the surface caused by the oxygen, ion, etc. dissolved in the solution.

Therefore, the chemical solution preferably contains an anticorrosive treating solution containing an anticorrosive agent. Naturally, a concentrate (of aqueous type) for such an anticorrosive treating solution needs to be such a concentrate as the anticorrosive agent contained therein is not precipitated in the form of precipitated particles. If an anticorrosive treating concentrate containing precipitated particles of anticorrosive agent is used per se or after dilution, for cleaning of semiconductor substrate surface, the staining of the surface is worsened by the precipitated particles. In particular, an anticorrosive agent such as BTA or the like, when precipitated once, is not easy to redissolve even when the temperature of treating solution is elevated; and fine precipitated particles, when sticking to the semiconductor substrate surface, are difficult to remove by cleaning alone.

Thus, the anticorrosive treating concentrate, if precipitated particles appear therein during carriage to destination or storage in destination after the production by concentrate maker, is very difficult to use as an anticorrosive treating solution in production of semiconductor device. Therefore, it is very important that the anticorrosive treating concentrate causes no precipitation of anticorrosive agent during the carriage and storage so that it can be safely used as an anticorrosive treating solution for semiconductor substrate.

In the present invention, as the anticorrosive agent constituting the anticorrosive treating concentrate, there can be mentioned triazole type compounds (heterocyclic compounds having three nitrogen atoms in the molecule) such as benzotriazole, 1,2,3-triazole, 1,2,4-triazole, carboxybenzotriazole, 1-hydroxybenzotriazole, nitrobenzotriazole, 5-methyl-1H-benzotriazole (TTA), dihydroxypropylbenzotriazole and the like.

There can also be mentioned 2-mercaptobenzthiazole (MBT), 2,5-dimercaptothiazole (DMTDA), benzimidazole (BIA), benzimidazolethiol (BIT), benzoxazolethiol (BOT), 4-methylimidazole, 5-hydroxymethyl-4-methylimidazole, etc.

In the present invention, these triazole type compounds and derivatives thereof can be suitably used alone or in combination of two or more kinds.

The anticorrosive agent can appropriately be dissolved in the concentrate in a concentration of 0.05 to 20%, preferably 0.1 to 10%, more preferably 0.4 to 5%. When the concentration is lower than the above lower limit, no sufficient corrosion inhibitability is obtained. Meanwhile, when the concentration is higher than the above upper limit, no further increase in corrosion inhibitability is obtained and the effect of prevention of particles precipitation by the precipitation inhibitor is not sufficient.

In the present invention, as the precipitation inhibitor enabling complete dissolution of the anticorrosive agent in the form of an aqueous solution, there are preferred compounds having no metal atom but having at least one nitrogen atom in the molecule. There can be mentioned, for example, ammonium hydroxide, tetramethylammonium hydroxide, amine compounds and amide compounds.

When there is used, as the precipitation inhibitor, a compound having an alkali metal, an alkaline earth metal or the like in the molecule, the ion of such a metal tends to stick to the surfaces of copper or copper alloy wirings on semiconductor substrate chemically and physically, deteriorating the insulatability of an insulating film formed on the above wirings; the ion, when sticking to the back side of the substrate, diffuses thermally through the substrate and reaches the transistor region, deteriorating the transistor property.

As the above-mentioned amine and amide compounds, water-soluble compounds are preferable. As the amine compounds, for example, monoethanolamine, triethanolamine, 2-(2-aminoethoxy)ethanol, 2-(2-aminoethylamino)ethanol, 2-(diethylamino)ethanol, 2-di(methylamino)ethanol, 1-amino-2-propanol, 2-amino-1-propanol, 3-aminol-propanol, 2-methylaminoethanol, 2-amino-2-methyl-1-propanol, 2-diethylaminoethanol, choline, morpholine, diethylenetriamine and triethylenetetramine can be used. As the amide compounds, there can be mentioned, for example, acetamide, N-methylacetamide, N,N-dimethylacetamide, N,N-dimethylacrylamide, 2-pyrrolidone, N-methylpyrrolidone and caprolactam.

In the present invention, these compounds can appropriately be used singly or in combination of two or more kinds. Of these precipitation inhibitors, preferred are monoethanolamine, 1-amino-2-propanol, 2-methylaminoethanol, 2-diethylaminoethanol, N,N-dimethylacetamide and N-methylpyrrolidone.

The precipitation inhibitor can appropriately be used in the anticorrosive treating concentrate in a concentration of 0.05 to 20%, preferably 0.1 to 10%, more preferably 0.4 to 5%. When the concentration is lower than the above lower limit, it is impossible to effectively prevent the precipitation of anticorrosive agent particles which may appear at ordinary use temperatures (5° C. or above) of the anticorrosive treating concentrate. Meanwhile, when the concentration is higher than the above upper limit, there is no further increase in preventability of precipitation of anticorrosive agent particles and simply a higher cost is incurred.

In the anticorrosive treating concentrate according to the present invention, the proportions of the anticorrosive agent and the precipitation inhibitor are not critical; however, the proportions are preferably determined so that the pH of the anticorrosive treating concentrate of aqueous solution type becomes 4 to 12, preferably 4 to 10.

When the pH of the concentrate is lower than the above lower limit, the concentrate has low stability at 20° C. or lower. When the pH is higher than the above upper limit, the concentrate, when used as an anticorrosive treating solution, invites etching of wirings-formed substrate and resultant corrosion and deterioration of copper wirings.

In the anticorrosive treating concentrate according to the present invention, the anticorrosive agent is used in the above-mentioned concentration. Meanwhile, the concentration of the precipitation inhibitor used in combination with the anticorrosive agent is not particularly restricted as long as the pH of the concentrate of aqueous solution type is in the above-mentioned range.

<Production, Storage and Carriage of Anticorrosive Treating Concentrate>

The anticorrosive treating concentrate of aqueous solution type according to the present invention, containing the above-mentioned anticorrosive agent and precipitation inhibitor can be produced as follows.

As mentioned previously, many of benzotriazole compounds (e.g. BTA) and their derivatives used as an anticorrosive agent have low solubility in water.

In producing an aqueous solution of such an anticorrosive agent, the particle shape of the anticorrosive agent is not critical; however, the particle shape is preferably, for example, a fine powder or small flakes in view of the solubility in water. As is clear from the temperature-solubility curve of BTA of FIG. 1, the anticorrosive agent is dissolved in water preferably by heating the water to an intended temperature, preferably to 40 to 90° C. and further by stirring the water, in order to obtain a higher dissolution rate.

First, a given amount of a predetermined anticorrosive agent of powder or flake form is added gradually to water and dissolved, with stirring.

When an anticorrosive treating concentrate is produced at a site near the production line of semiconductor device, the above-mentioned problem during the carriage or storage of the concentrate does not take place. However, since anticorrosive agents such as BTA and the like are used in the form of a powder, it is not appropriate to treat an anticorrosive agent (e.g. BTA) powder at the production line of semiconductor device where very high cleanness is required. Therefore, dissolution of anticorrosive agent needs be done at a site isolated from the production line of semiconductor device. Hence, it is necessary to produce an anticorrosive treating concentrate at a site distant from the production line of semiconductor device, carry the produced concentrate to the production line of semiconductor device, and store it until it is used.

From such a standpoint, it is very important to provide an anticorrosive treating solution which can be used by dilution.

Many of the precipitation inhibitors usable in the present invention are liquid and some of them have low boiling points and are volatile. Even such precipitation inhibitors may beforehand be placed in water. Those precipitation inhibitors having boiling points higher than the predetermined dissolution temperature are preferably placed in water beforehand in given amounts so that an anticorrosive agent can be dissolved completely at a high dissolution rate. After dissolution, the resulting solution is allowed to cool to room temperature; water is added thereto for concentration adjustment; thereby, an anticorrosive treating concentrate of desired concentration is obtained; a given amount of the concentrate is placed in a product container to obtain an anticorrosive treating concentrate product.

Such an anticorrosive treating concentrate placed in a container is stored in a store house before carriage or carried to a destination.

The anticorrosive treating concentrate placed in a container can remain as a complete aqueous solution free from precipitated particles, even when the environmental temperature of the concentrate during the storage after production, carriage to destination or storage at destination falls from the level right after production of the concentrate to, for example, 10° C. or lower. The anticorrosive treating concentrate according to the present invention can be carried or stored more stably by maintaining the environmental temperature at a level at least equal to the precipitation temperature of the anticorrosive agent contained in the concentrate. When the anticorrosive treating concentrate according to the present invention is carried to a cold district or the environmental temperature falls to the precipitation temperature of lower during the storage of the concentrate, heating of the concentrate or heat insulation of the concentrate by wrapping with a foamed polystyrene or the like is effective.

<Applications of Anticorrosive Treating Concentrate>

The anticorrosive treating concentrate according to the present invention, by itself or after being diluted to several tens- to hundred-fold with a water or the like, is used as various anticorrosive treating solutions such as preservative solution, protective film-forming solution and cleaning solution. For example, the concentrate is used as a cleaning solution which is sprayed, for cleaning, on a copper or copper alloy of semiconductor substrate, formed by a damascene process and then subjected to CMP. The concentrate is also used as a preservative solution in which a semiconductor substrate cleaned as above is immersed temporarily without being allowed to stand in the atmosphere. The concentrate is also used as a protective film-forming solution which is coated on a fresh metal surface of semiconductor substrate, obtained by surface polishing (e.g. CMP), to form a very thin (several nm) protective film made of BTA or the like.

Thus, unlike conventional rust preventives which form a corrosion-resistant protective film (a passive-state film) of several μm to several tens of μm in thickness on a metal surface requiring corrosion resistance, the anticorrosive treating concentrate according to the present invention is used for cleaning of, for example, metal wirings on semiconductor substrate, or is used as a preservative solution for temporarily storing therein a semiconductor substrate having metal wirings so that the metal wirings is not deteriorated due to formation of oxide film or the like. When the anticorrosive treating concentrate according to the present invention is used as a protective film-forming solution, the thickness of the formed film is 50 nm or less and such a thin film is ordinarily detached and removed in a step of forming an insulating film under the conditions of vacuum and heating (200 to 300° C.).

EXAMPLES

The present invention is described in more detail below by way of Examples. However, the present invention is in no way restricted by these Examples.

Examples 1 to 9 and Comparative Example 1

Various anticorrosive treating concentrates were prepared, then allowed to stand at various temperatures, and examined for stability (degree of precipitation of crystals). The results are shown in Table 1, wherein ○ indicates no particles precipitation and X indicates crystals precipitation.

As shown in Table 1, various anticorrosive agents and various precipitation inhibitors were dissolved in water to prepare various anticorrosive treating concentrates according to the present invention. Each concentrate was allowed to stand at ordinary environmental temperatures (5° C., 15° C. and 20° C.) to examine its stability.

TABLE 1

| | Composition of concentrate for anticorrosive treating solution (wt-%) | | pH and stability of anticorrosive treating concentrate | | | |
|---|---|---|---|---|---|---|
| | | | pH | 20° C. | 15° C. | 5° C. |
| Example 1 | Benzotriazole | 2 | 9.5 | ○ | ○ | ○ |
| | Ammonium hydroxide | 0.4 | | | | |
| Example 2 | Benzotriazole | 2 | 9.6 | ○ | ○ | ○ |
| | 1-Amino-2-propanol | 2 | | | | |
| Example 3 | Benzotriazole | 3 | 9.5 | ○ | ○ | ○ |
| | 1-Amino-2-propanol | 2.5 | | | | |
| Example 4 | Benzotriazole | 2 | 9.1 | ○ | ○ | ○ |
| | Monoethanolamine | 1.4 | | | | |
| Example 5 | Benzotriazole | 3 | 8.6 | ○ | ○ | ○ |
| | 2-Diethylaminoethanol | 2 | | | | |
| Example 6 | Benzotriazole | 3 | 4.7 | ○ | ○ | ○ |
| | N-methylpyrrolidone | 5 | | | | |
| Example 7 | Benzotriazole | 3 | 4.7 | ○ | ○ | ○ |
| | N,N-dimethyl-acetamide | 5 | | | | |
| Example 8 | 1-Hydroxy-benzotriazole | 3 | 9.3 | ○ | ○ | ○ |
| | 1-Amino-2-propanol | 2 | | | | |
| Example 9 | 5-Methyl-1H-benzotriazole | 3 | 9.3 | ○ | ○ | ○ |
| | 1-Amino-2-propanol | 2 | | | | |
| Comparative Example 1 | Benzotriazole | 2 | 4.7 | ○ | X | X |

As is clear from Table 1, the anticorrosive treating concentrates according to the present invention, i.e. the concentrates of Examples 1 to 9 had pHs of 4.7 to 9.6, showed no precipitation of BTA crystals and were very stable at temperatures of 5 to 20° C. Meanwhile, a conventional BTA aqueous solution containing no precipitation inhibitor of the present invention, i.e. the BTA aqueous solution of Comparative Example 1 had a pH of 4.7 (lower than 6), and precipitated BTA crystals at temperatures lower than 20° C. (15° C. and 5° C.) and was unusable as an anticorrosive treating solution.

Example 10

The anticorrosive treating concentrate containing 3% of BTA, prepared in Example 3 was placed in a container at an atmospheric temperature of 17° C., then carried to a cold district having an atmospheric temperature of 0 to 5° C., and allowed to stand at that temperature for 3 days. As a result, there was no suspension of fine BTA particles or no cloudiness in the container, that is, there was no precipitation of crystals.

Example 11

The anticorrosive treating concentrate containing 3% of BTA, prepared in Example 3 was diluted with water to prepare two kinds of cleaning solutions each containing 0.3% or 0.07% of BTA.

Separately, a semiconductor substrate having copper wirings formed by a damascene process was subjected to CMP to produce a wafer having a polished copper surface.

The polished copper surface stained with an abrasive and a polishing residue was cleaned by an ordinary method of spraying each of the above-prepared cleaning solutions. Then, the cleaned copper surface was observed using a optical microscope. As a result, the surface was very clean. Thus, the anticorrosive treating concentrate according to the present invention is effectively usable as a cleaning solution for wafer. Further, there was no sticking of precipitated particles to the surface of semiconductor substrate.

Example 12

The wafer having a cleaned copper surface, obtained in Example 11 was stored by immersing it for 1 day in the anticorrosive treating solution containing 1% of BTA, prepared in Example 6.

Then, the wafer was taken out from the solution into the atmosphere, cleaned and dried, after which the copper surface was observed using an optical microscope. As a result, there was no change in surface cleanness and there was no surface deterioration such as formation of oxide film. For comparison, the wafer having a cleaned copper surface, obtained in Example 11 was cleaned, dried, and allowed to stand in the atmosphere for 1 day; a thin oxide film was observed on the surface.

Thus, the anticorrosive treating solution of the present invention can be used as a preservative solution of immersion type for copper surface.

Example 13

The wafer obtained in Example 11 by subjecting a semiconductor substrate having copper wirings formed by a damascene process, to CMP and then cleaning the polished copper surface with a cleaning solution containing 0.07% of BTA, was coated with an anticorrosive treating solution containing 1% of BTA, obtained by diluting the concentrate obtained in Example 3; then, allowed to stand; washed with water; and vacuum-dried. The vacuum drying allowed the precipitation inhibitor (1-amino-2-propanol) to vaporize, whereby a thin film of BTA (anticorrosive agent) was formed. Also, for comparison, a wafer not coated with the same anticorrosive treating solution containing 1% of BTA was prepared. The two wafers prepared above were allowed to stand in an atmosphere of 20° C. for 7 days. As a result, the copper surface of the former wafer showed no abnormality; however, the copper surface of the latter wafer, when visually inspected, showed formation of an oxide film in the third day.

Thus, the anticorrosive treating solution according to the present invention, when coated on a copper fresh surface, followed by water-washing and drying, can form, on the surface, a very thin protective film for prevention of oxidation and is useful as a protective film-forming solution.

Example 14

Anticorrosive treating concentrates according to the present invention were prepared by adding, to water, BTA in an amount of 0.3 to 5% by weight and 1-amino-2-propanol (a precipitation inhibitor) in such an amount that the pH of the resulting aqueous concentrate became 7.5 to 9.5. Each aqueous concentrate was allowed to stand at an environmental temperature of 5° C. for 30 minutes or 8 hours to examine the stability. The results are shown in Table 2 (30 minutes standing) and Table 3 (8 hours standing). In the tables, ○ indicates no precipitation of particles; Δ indicates slight cloudiness; X indicates precipitation of crystals.

TABLE 2

| BTA concentration | pH of anticorrosive treating concentrate (5° C. × 30 minutes) | | | |
|---|---|---|---|---|
| (%) | 7.5 | 8.2 | 9.0 | 9.5 |
| 0.3 | ○ | ○ | ○ | ○ |
| 1 | X | X | ○ | ○ |
| 2 | X | X | ○ | ○ |
| 3 | X | X | ○ | ○ |
| 4 | | | ○ | ○ |
| 5 | | | Δ | ○ |

TABLE 3

| BTA concentration | pH of anticorrosive treating concentrate (5° C. × 8 hours) | | | |
|---|---|---|---|---|
| (%) | 7.5 | 8.2 | 9.0 | 9.5 |
| 0.3 | ○ | ○ | ○ | ○ |
| 1 | X | X | ○ | ○ |
| 2 | X | X | ○ | ○ |
| 3 | X | X | ○ | ○ |
| 4 | | | Δ | Δ |
| 5 | | | X | Δ |

It is well appreciated from the above that the anticorrosive treating concentrate according to the present invention can remain as a complete aqueous solution even at a low temperature of 5° C., depending upon the concentration of the BTA used and the amount of the precipitation inhibitor used (or the alkalinity imparted by the addition of the precipitation inhibitor).

Example 15

A semiconductor substrate was subjected to a damascene process to form copper wirings thereon. The resulting substrate was subjected to CMP to make fresh the surfaces of the copper wirings. A stable anticorrosive treating concentrate of pH 9.5 according to the present invention, containing BTA and 1-amino-2-propanol was diluted to obtain an anticorrosive treating solution containing BTA in a concentration of 0.05%. The above-obtained fresh surfaces of copper wirings were subjected to a cleaning treatment (treatment 1) using the above anticorrosive treating solution.

Then, the resulting semiconductor substrate was subjected to ordinary cleaning and drying, after which a $Si_3N_4$ insulating film was formed on the copper wirings and the peelability of the insulating film was examined according to the following adhesivity test. For comparison, the same fresh surfaces of copper wirings were subjected to a conventional cleaning treatment (treatment 2) using TBA alone or to a cleaning treatment (treatment 3) using no TBA, after which the same insulating film was formed on the copper wirings and the peelability of the insulating film was examined according to the same adhesivity test. The results are shown in Table 4. Incidentally, the insulating film was formed on the copper wirings right after cleaning treatment, the copper wirings after cleaning treatment and subsequent standing in atmosphere for 1 day, and the copper wirings after cleaning treatment and subsequent standing in atmosphere for 3 days.

<Adhesivity test>

The adhesivity test for the $Si_3N_4$ insulating film to the copper on substrate was conducted by applying cross-cut lines to the insulating film at intervals of 1 mm so as to form 100 squares in the film, then attaching a pressure-sensitive adhesive tape on the insulating film, peeling the tape, counting the number of the squares peeled together with the tape, and calculating the proportion (%) of the peeled squares relative to the total (100) squares.

TABLE 4

| Cleaning treatment | | $Si_3N_4$ film peelability (%) | | |
|---|---|---|---|---|
| Treatment method | Concentration of treating solution (%) | Right after | After 1 day | After 3 days |
| 1 | 0.05 | 0.01 | 0.03 | 0.04 |
| 2 | 0.05 | 0 | 0.02 | 0.04 |
| 3 | 0 | 40 | 67 | 82 |

As is clear from the result of the treatment method 1 of Table 4, the anticorrosive treating solution of the present invention containing a precipitation inhibitor shows no adverse effect on the peelability of insulating film and does not impair the reliability (EM) of damascene wirings.

The present invention can provide an anticorrosive treating concentrate for a copper or copper alloy surface, containing an anticorrosive agent such as BTA or the like and a precipitation inhibitor such as 1-amin-2-propanol, N-methylpyrrolidone or the like and having a pH of 4 to 12, in which concentrate the anticorrosive agent is completely dissolved in water in a concentration of 0.05 to 20% at environmental temperatures.

Therefore, the concentrate can be prepared in a high concentration and can be carried at a low cost as an aqueous solution type product.

The concentrate, when used as a treating solution, is completely or substantially free from precipitation of crystals or the like; therefore, there is no sticking of precipitates of anticorrosive agent to semiconductor substrate and the yield of semiconductor device can be increased.

Further, the concentrate is completely or substantially free from precipitation of crystals or the like during the storage or carriage and, therefore, causes no concentration change or no deterioration of solution quality; therefore, stable corrosion inhibitability is exhibited The concentrate is completely or substantially free from precipitation of crystals or the like; therefore, there is no need of restirring or redissolution before use in semiconductor device production and the burden on the person using the concentrate can be lessened.

In the concentrate, the temperature dependency of the solubility of anticorrosive agent in water is lowered; therefore, even when the temperature control of the concentrate is relaxed, there is no precipitation of anticorrosive agent particles and the cost of production facility can be made low.

The concentrate is a solution type and can make the precipitation of crystals or the like zero or substantially zero; therefore, the concentrate having a higher concentration than conventional products can be carried to a destination stably or stored at the destination stably.

This application is based on Japanese patent application NO.HEI2000-58376 filed on Mar. 3, 2000, the content of which is incorporated hereinto by reference.

What is claimed is:

1. An anticorrosive treating concentrate which is a concentrate for an anticorrosive treating solution used for corrosion inhibition treatment of a semiconductor substrate having an exposed surface of a metal, said concentrate consisting of:
   a triazole type compound as an anticorrosive agent, wherein the triazole type compound as anticorrosive agent is selected from the group consisting of 1,2,3-triazole, 1,2,4-triazole, carboxybenzotriazole, 1-hydroxybenzotriazole, nitrobenzotriazoie, 5-methyl-1H-benzo-triazole and dihydroxypropylbenzotriazole, and
   a precipitation inhibitor for the anticorrosive agent is selected from the group consisting of amine compounds and amide compounds,
   balance water, and
   wherein the concentration of the precipitation inhibitor is in a range of 0.05 to 20 wt-%.

2. The anticorrosive treating concentrate according to claim 1, wherein said anticorrosive treating solution contains effective ingredients in the same or lower concentrations as or than in the concentrate.

3. The anticorrosive treating concentrate according to claim 1, wherein the metal is copper or a copper alloy.

4. The anticorrosive treating concentrate according to claim 1, wherein the concentration of the anticorrosive agent is in a range of 0.05 to 20 wt-%.

5. The anticorrosive treating concentrate according to claim 1, wherein the amine and amide compounds are water-soluble and have no metal atom in the molecule.

6. The anticorrosive treating concentrate according to claim 1, wherein the amine compound is selected from the group consisting of monoethanolamine, diethanolamine, triethanolamine, 2-(2-aminoethoxy) ethanol, 2(2-aminoethylamino) ethanol, 2-(diethylamino) ethanol, 2-di(methylamino) ethanol, 1-amino-2-propanol, 2-amino-1-propanol, 3-amino-1-propanol, 2-methylaminoethanol, 2-amino-2-methyl-1-propanol, 2diethylaminoethanol, choline, morpholine, diethylenetriamine and triethylenetetramine.

7. The anticorrosive treating concentration according to claim 1, having a pH of 4 to 10.

8. The anticorrosive treating concentrate according to claim 1, wherein the particular anticorrosive agent, and concentration thereof, and the particular precipitation inhibitor, and concentration thereof, are selected to allow for storage of the concentrate at environmental temperatures which are at least the precipitation temperature of the anticorrosive agent.

9. A method for carrying an anticorrosive treating concentrate wherein the anticorrosive treating concentrate is the concentrate which is claimed in claim 1, comprising the steps of:
   placing the concentrate for carrying in temperature conditions where the anticorrosive agent contained in the concentrate does not precipitate, and
   maintaining the concentrate during carriage at a temperature so as not to lower the temperature of the concentrate below that of the precipitation temperature of the anticorrosive agent contained in the concentrate.

10. A method for storing an anticorrosive treating concentrate wherein the anticorrosive treating concentrate is the concentrate which is claimed in claim 1, comprising the steps of:
    placing the concentrate for storing in temperature conditions where the anticorrosive agent contained in the concentrate does not precipitate, and
    maintaining the concentrate during storage at a temperature so as not to lower the temperature of the concentrate below that of the precipitation temperature of the anticorrosive agent contained in the concentrate.

11. A method for carrying an anticorrosive treating concentrate which is a concentrate for an anticorrosive treating solution used for corrosion inhibition treatment of a semiconductor substrate having an exposed surface of a metal, said concentrate consisting of:
    a triazole type compound as an anticorrosive agent, wherein the triazole type compound as anticorrosive agent is selected from the group consisting of 1,2,3-triazole, 1,2,4triazole, carboxybenzotriazole, 1-hydroxybenzotriazole, nitrobenzotriazole, 5-methyl-1H-benzo-triazole and dihydroxypropylbenzotriazole, and
    a precipitation inhibitor for the anticorrosive agent is selected from the group consisting of amine compounds and amide compounds,
    balance water, said method comprises carrying the concentrate by keeping the concentrate at temperatures which are at least the precipitation temperature of the anticorrosive agent contained in the concentrate.

12. A method for storing an anticorrosive treating concentrate which is a concentrate for an anticorrosive treating solution used for corrosion inhibition treatment of a semiconductor substrate having an exposed surface of a metal, said concentrate consisting of:
    a triazole type compound as an anticorrosive agent, wherein the triazole type compound as anticorrosive agent is selected from the group consisting of 1,2,3-triazole, 1,2,4-triazole, carboxybenzotriazole, 1-hydroxybenzotriazole, nitrobenzotriazole, 5-methyl-1H-benzo-triazole and dihydroxypropylbenzotriazole, and
    a precipitation inhibitor for the anticorrosive agent selected from the group consisting of amine compounds and amide compounds,
    balance water,
    said method comprises storing the concentrate by keeping the concentrate at temperatures which are at least the precipitation temperature of the anticorrosive agent contained in the concentrate.

13. An anticorrosive treating concentrate which is a concentrate for an anticorrosive treating solution used for corrosion inhibition treatment of a semiconductor substrate having an exposed surface of a metal, said concentrate consisting of:

a triazole type compound and/or a derivative thereof as an anticorrosive agent, and a precipitation inhibitor for the anticorrosive agent selected from the group consisting of acetamide, N-methylacetamide, N,N-dimethylacetamide, N,N-dimethylacrylamide, 2-pyrrolidone, N-methylpyrrolidone and caprolactam, balance water.

14. The anticorrosive treating concentrate according to claim 13, wherein said anticorrosive treating solution contains effective ingredients in the same or lower concentrations as or than in the concentrate.

15. The anticorrosive treating concentrate according to claim 13, wherein the metal is copper or a copper alloy.

16. The anticorrosive treating concentrate according to claim 13, wherein the concentration of the anticorrosive agent is in a range of 0.05 to 20 wt-%.

17. The anticorrosive treating concentration according to claim 13, having a pH of 4 to 10.

18. The anticorrosive treating concentrate according to claim 13, wherein the particular anticorrosive agent, and concentration thereof, and the particular precipitation inhibitor, and concentration thereof, are selected to allow for storage of the concentrate at environmental temperatures which are at least the precipitation temperature of the anticorrosive agent.

19. A method for carrying an anticorrosive treating concentrate wherein the anticorrosive treating concentrate is the concentrate which is claimed in claim 13, comprising the steps of:

placing the concentrate for carrying in temperature conditions where the anticorrosive agent contained in the concentrate does not precipitate, and maintaining the concentrate during carriage at a temperature so as not to lower the temperature of the concentrate below that of the precipitation temperature of the anticorrosive agent contained in the concentrate.

20. A method for storing an anticorrosive treating concentrate wherein the anticorrosive treating concentrate is the concentrate which is claimed in claim 13, comprising the steps of:

placing the concentrate for storing in temperature conditions where the anticorrosive agent contained in the concentrate does not precipitate, and maintaining the concentrate during storage at a temperature so as not to lower the temperature of the concentrate below that of the precipitation temperature of the anticorrosive agent contained in the concentrate.

21. An anticorrosive treating composition consisting of:

0.05 to 20 wt-% of a triazole type compound as an anticorrosive agent selected from the group consisting of 1,2,3-triazole, 1,2,4-triazole, carboxybenzotriazole, 1-hydroxybenzotriazole, nitrobenzotriazole, 5-methyl-1H-benzotriazole and dihydroxypropylbenzotriazole, and 0.05 to 20 wt-% of a precipitation inhibitor for the anticorrosive agent selected from the group consisting of acetamide, N-methylacetamide, N, N-dimethylacetamide, N,N-dimethylacrylamide, 2-pyrrolidone, N-methylpyrrolidone, caprolactam, monoethanolamine, diethanolamine, triethanolamine, 2-(2-aminoethoxy)ethanol, 2(2-aminoethylamino)ethanol, 2-(diethylamino) ethanol, 2-di(methylamino)ethanol, 1-amino-2-propanol, 2amino-1-propanol, 3-amino-1-propanol, 2-methylamino-ethanol, 2-amino-2-methyl-1-propanol, 2-diethylaminoethanol, choline, morpholine, diethylenetriamine and triethylenetetramine, balance water.

22. An anticorrosive treating composition consisting of:

0.05 to 20 wt-% of a triazole type compound as an anticorrosive agent selected from the group consisting of benzotriazole, 1,2,3-triazole, 1,2,4-triazole, carboxybenzotriazole, 1-hydroxybenzotriazole, nitrobenzotriazole, 5-methyl-1H-benzotriazole and dihydroxypropylbenzotriazole, 0.05 to 20 wt-% of a precipitation inhibitor for the anticorrosive agent selected from the group consisting of acetamide, N-methylacetamide, N,N-dimethylacetamide, N,N-dimethylacrylamide, 2-pyrrolidone, N-methylpyrrolidone and caprolactam, and balance water.

23. An anticorrosive treating composition comprising:

0.05 to 20 wt-% of a triazole type compound as an anticorrosive agent selected from the group consisting of benzotriazole, 1,2,3-triazole, 1,2,4-triazole, carboxybenzotriazole, 1-hydroxybenzotriazole, nitrobenzotriazole, 5-methyl-1H-benzotriazole and dihydroxypropylbenzotriazole, 0.4 to 5 wt-% of a precipitation inhibitor for the anticorrosive agent selected from the group consisting of acetamide, N-methylacetamide, N,N-dimethylacetamide, N,N-dimethylacrylamide, 2-pyrrolidone, N-methylpyrrolidone, caprolactam, monoethanolamine, diethanolamine, triethanolamine, 2-(2-aminoethoxy)ethanol, 2-(2-aminoethylamino)ethanol, 2-(diethylamino) ethanol, 2-di(methylamino)ethanol, 1-amino-2-propanol, 2-amino-1-propanol, 3-amino-1-propanol, 2-methylaminoethanol, 2-amino2-methyl-1-propanol, 2-diethylaminoethanol, choline, morpholine, diethylenetriamine and triethylenetetramine; and balance water.

24. The anticorrosive treating composition according to claim 23, wherein the concentration of the anticorrosive agent is in a range of 0.4 to 5 wt%.

25. The anticorrosive treating composition according to claim 23, having a pH of 4 to 10.

26. A method for carrying an anticorrosive treating composition wherein the anticorrosive treating composition is the composition which is claimed in claim 23, comprising the steps of:

placing the composition for carrying in temperature conditions where the anticorrosive agent contained in the composition does not precipitate, and maintaining the composition during carriage at a temperature so as not to lower the temperature of the composition below that of the precipitation temperature of the anticorrosive agent contained in the composition.

27. A method for storing an anticorrosive treating composition wherein the anticorrosive treating composition is the composition which is claimed in claim 23, comprising the steps of:

placing the composition for storing in temperature conditions where the anticorrosive agent contained in the composition does not precipitate, and maintaining the composition during storage at a temperature so as not to lower the temperature of the composition below that of the precipitation temperature of the anticorrosive agent contained in the composition.

* * * * *